(12) United States Patent
Park et al.

(10) Patent No.: US 6,316,313 B1
(45) Date of Patent: Nov. 13, 2001

(54) METHOD OF MANUFACTURING A FLASH MEMORY DEVICE

(75) Inventors: Sung Kee Park, Gyunsangbuk-Do; Ki Seog Kim, Kyungki-Do; Sang Hoan Chang, Kyungki-Do; Keun Woo Lee, Kyungki-Do, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/717,002

(22) Filed: Nov. 22, 2000

(30) Foreign Application Priority Data

Dec. 28, 1999 (KR) .................................................. 99-63905

(51) Int. Cl.[7] .............................................. H01L 21/8247
(52) U.S. Cl. ........................................... 438/257; 438/264
(58) Field of Search ..................... 438/257–267

(56) References Cited

U.S. PATENT DOCUMENTS

| 6,187,635 | * | 2/2001 | Kaya | 438/264 |
| 6,207,507 | * | 3/2001 | Wang | 438/267 |
| 6,277,689 | * | 8/2001 | Wong . | |

* cited by examiner

*Primary Examiner*—Richard Booth
(74) *Attorney, Agent, or Firm*—Pennie & Edmonds LLP

(57) ABSTRACT

There is disclosed a method of manufacturing a flash memory device. In order to solve the problems that a well resistance and a parasitic capacitance are great and the erase speed of a device is slow in case of the conventional flash memory device, the present invention forms a well region of a sector unit by use of a metal silicide layer and defines an unit cell by use of a ploysilicon layer. Thus, it can reduce the well resistance and the parasitic capacitance. Also, it can improve the operating speed of the device and can reduce the manufacturing cost by allowing the erase operation of a cell unit.

19 Claims, 2 Drawing Sheets

METHOD OF MANUFACTURING A FLASH MEMORY DEVICE

FIELD OF THE INVENTION

The invention relates generally to a method of manufacturing a flash memory device, and more particularly to a method of manufacturing a flash memory device capable of reducing a well resistance and a parasitic capacitance in the flash memory device.

BACKGROUND OF THE INVENTION

In general, a well region in a flash memory device is formed through the process by which ions are implanted into a semiconductor substrate and are diffused by thermal process. However, the diffused well region formed by this method has the following drawbacks.

Firstly, the diffused well region has a high well resistance of several Ω~ several hundreds KΩ. Thus, there is a drawback in the erase speed due to delay time RC. This provides the flash memory device with the cause of defeat in competing the speed with DRAM or SRAM.

Secondly, it has a high parasitic capacitance. Most of the flash cells use a triple P-well structure. The reason is to reduce the resistance of the well, by performing erase operation by which a bias is applied to the well in the flash cell. The operating speed of the device is higher as the delay time (=RC) is smaller. However, as some time taken to charge the parasitic capacitance of this structure itself is required, this affects the major cause slowing the operating speed of the device. This causes a problem that a given level of voltage must be maintained in order to charge the parasitic capacitance. Also, it is one of the most important problems in designing a flash memory device such as a charge pump size in a low-voltage flash memory device design.

Thirdly, there is a problem in the erase speed. The smallest unit of erase in the conventional flash cell is a block (or sector) unit, wherein one block is typically 512 Kbits. That is, the conventional flash memory device can be programmed in one cell unit but could not be erased in one cell unit. Also, as the conventional flash memory device could not be erased in one cell unit, it must be erased in one block unit. Thus, when the erase operation is performed, various problems are generated due to a surplus current flowing into a bit line. There is a difficulty in a design for reducing this bit line current.

SUMMARY OF THE INVENTION

It is therefore an object of the present invention to provide a method of manufacturing a flash memory device capable of improving an electric characteristic of a flash memory device by forming a well region using a metal silicide in the flash memory device.

In order to accomplish the above object, a method of manufacturing a flash memory device according to the present invention is characterized in that it comprises the steps of sequentially forming an oxide film, a pad polysilicon layer, a metal silicide layer, a first un-doped polysilicon layer and a buffer oxide film on a substrate, etching selected regions on the buffer oxide film, the first un-doped polysilicon layer, the metal silicide layer, the pad polysilicon layer and the oxide film, using a first ISO mask, to form a first trench, whereby an unit sector is defined, after forming an intermediate thermal oxide film on the entire structure in which the first trench is formed, flattening the intermediate thermal oxide film until the surface of the buffer oxide film is exposed, thus burying the intermediate thermal oxide film only within the first trench, etching selected regions of the buffer oxide film and the first un-doped polysilicon layer, using a second ISO mask, so that the surface of the tungsten silicide layer can be exposed, to form a second trench, whereby an unit cell is defined, forming a second un-doped polysilicon layer on the entire structures in which the second trench is formed, and then flattening the second un-doped polysilicon layer, and annealing the second un-doped polysilicon layer to crystallize the second un-doped polysilicon layer, and performing a threshold voltage ion implantation process and a well ion implantation process to the entire structure including the crystallized second un-doped polysilicon layer, and then performing a thermal process, whereby a well region is formed.

BRIEF DESCRIPTION OF THE DRAWINGS

The aforementioned aspects and other features of the present invention will be explained in the following description, wherein.

DETAILED DESCRIPTION OF PREFERRED EMBODIMENTS

Figure 1A:
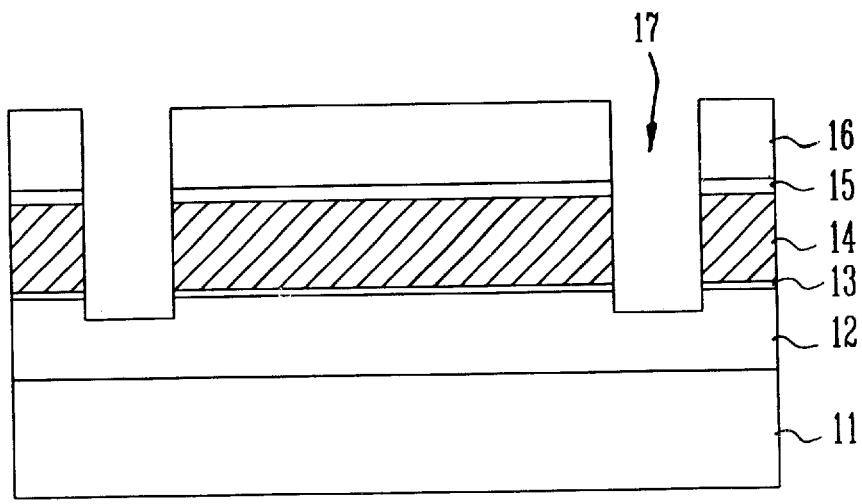
FIGS. 1A to 1E are cross-sectional views of a device for explaining a method of manufacturing a flash memory device according to the present invention.

The present invention will be described in detail by way of a preferred embodiment with reference to accompanying drawings, in which like reference numerals are used to identify the same or similar parts.

FIGS. 1A to 1E are cross-sectional views of a device for explaining a method of manufacturing a flash memory device according to the present invention.

Referring now to FIG. 1A, an oxide film 12, a pad polysilicon layer 13, a metal silicide layer 14, a first un-doped polysilicon layer 15 and a buffer oxide film 16 are sequentially formed on a substrate 11. Thereafter, a first ISO mask is defined to a desired block size. The buffer oxide film 16, the first un-doped polysilicon layer 15, the metal silicide layer 14, the pad polysilicon layer 13 and the oxide film 12 are etched, using the first ISO mask, to form a first trench 17. At this time, the oxide film 12 is formed in thickness of 3000 Å and the pad polysilicon layer 13 is formed in thickness of 100 Å. Also, the metal silicide layer 14 is formed in thickness of 1500~3000 Å using one of tungsten, titanium, aluminum, copper, etc. and the un-doped polysilicon layer 15 and the buffer oxide film 16 each are formed in thickness of 1000 Å and 3000 Å. Further, the thickness of the oxide film 12 removed upon etching of the first trench 17 is preferably about ⅓ of the thickness of the total oxide film 12. The flash memory device is divided into a sector unit by this first trench 17.

Figure 1B:
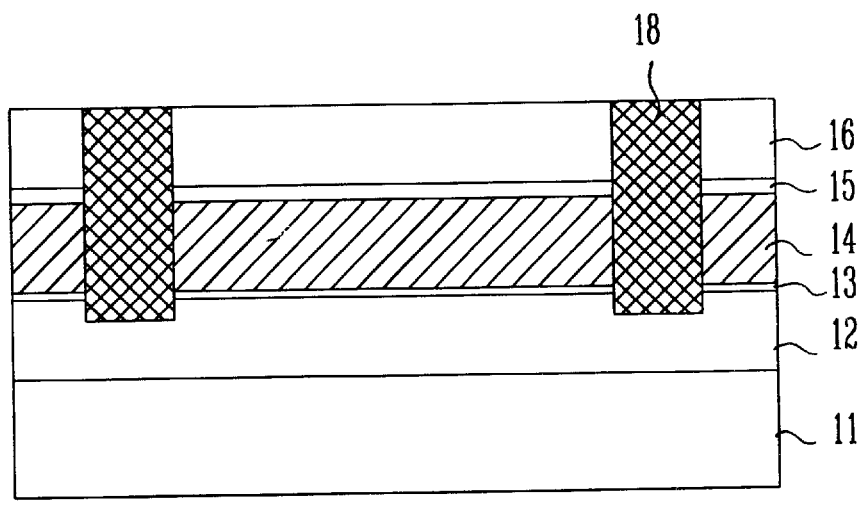

Next, as shown in FIG. 1B, an intermediate thermal oxide film 18 is formed on the entire structure in which the first trench 17 is formed and is then removed by etch back or chemical mechanical polish process until the surface of the buffer oxide film 16 is exposed, so that the intermediate thermal oxide film 18 can be buried only within the first trench 17. At this time, the intermediate thermal film 18 is formed in thickness of 10000 Å.

Figure 1C:
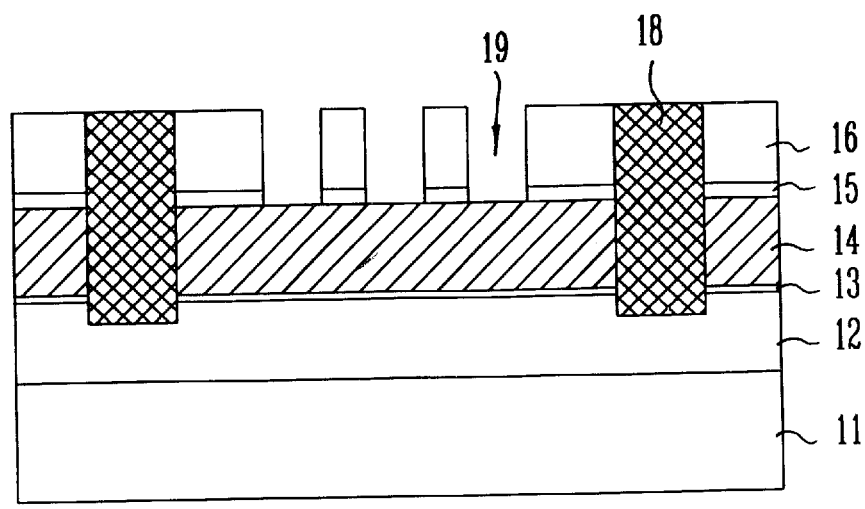

Referring to FIG. 1C, a second ISO mask is defined in a line shape. Using this, selected regions of the buffer oxide film 16 and the first un-doped polysilicon layer 15 are etched to form a second trench 19. The flash memory device is divided into a cell unit by the second trench 19.

Figure 1D:
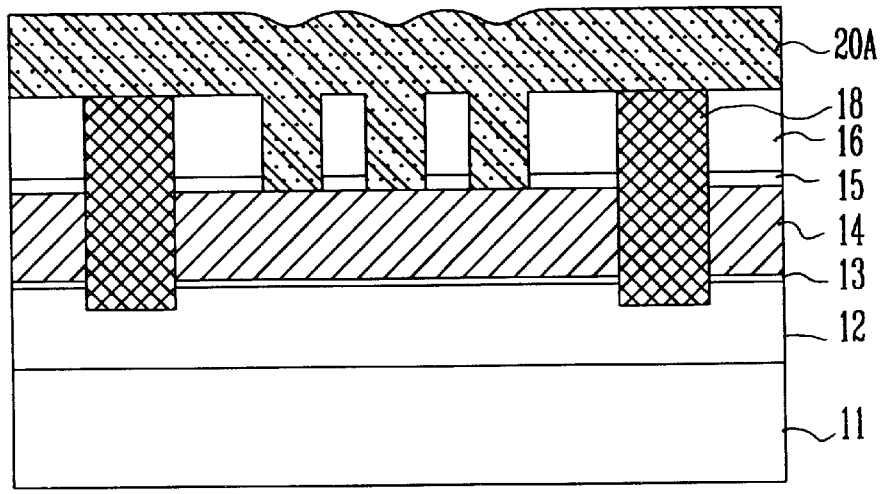

As shown in FIG. 1D, a second un-doped polysilicon layer 20A is formed on the entire structure in which the second trench 19. The second un-doped polysilicon layer 20A is formed in thickness of 3000 Å.

Figure 1E:
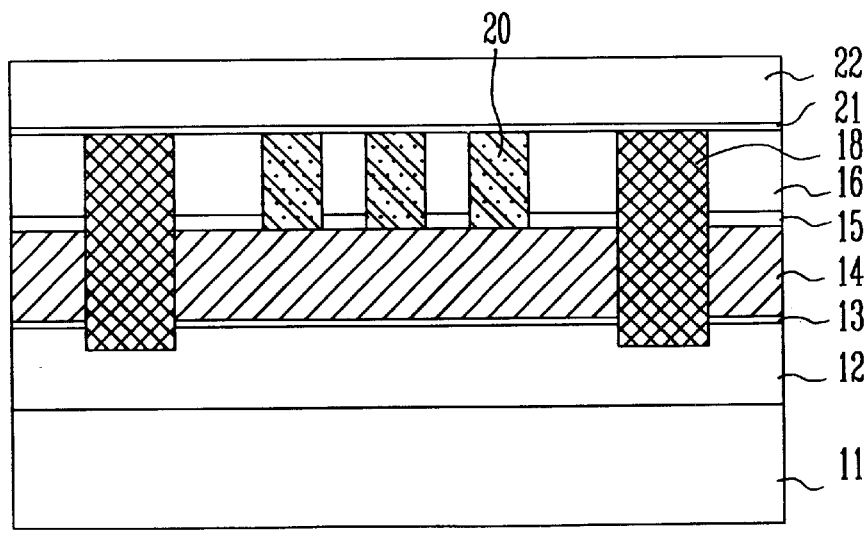

Then, as shown in FIG. 1E, after the second un-doped polysilicon layer 20A is flattened, an annealing process is performed. By this annealing process, etching damages can be mitigated and a second crystallized un-doped polysilicon layer 20 can be obtained. Thereafter, a threshold voltage ion implantation process and a well ion implantation process are performed and a rapid thermal process (RPT) is performed. Then, a process for manufacturing a flash memory device such as forming a tunnel oxide film 21 and a first polysilicon layer 22, etc. are continued.

As such, the present invention can reduce the well resistance from conventionally several KΩ~several hundreds KΩ to several Ω, by using a metal silicide layer instead of a diffused well structure. Also, according to the present invention, as the metal silicide layer is separated, the erase operation can be performed in unit below 512K by so that a well structure can be made suitable for design purposes.

As mentioned above, the present invention can improve a well resistance and a parasitic capacitance of a flash memory device and can improve its erase speed, by forming a well region of the flash memory device using metal silicide. Further, it can significantly reduce the manufacturing cost since manufacturing a flash memory device needs not be necessarily performed on a silicon wafer. Also, if the operating speed of a flash memory device is further improved, it is expected that the flash memory device can substitute DRAMs and SRAMs.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a flash memory device, comprising the steps of:
    sequentially forming an oxide film, a pad polysilicon layer, a metal silicide layer, a first un-doped polysilicon layer and a buffer oxide film on a substrate;
    etching selected regions on said buffer oxide film, said first un-doped polysilicon layer, said metal silicide layer, said pad polysilicon layer and said oxide film, using a first ISO mask, to form a first trench, whereby a unit sector is defined;
    after forming an intermediate thermal oxide film on the entire structure in which said first trench is formed, flattening said intermediate thermal oxide film until the surface of said buffer oxide film is exposed, thus burying said intermediate thermal oxide film only within said first trench;
    etching selected regions of said buffer oxide film and said first un-doped polysilicon layer, using a second ISO mask, so that the surface of said metal silicide layer can be exposed, to form a second trench, whereby an unit cell is defined;
    forming a second un-doped polysilicon layer on the entire structure in which said second trench is formed, and then flattening said second un-doped polysilicon layer, and annealing said second un-doped polysilicon layer to crystallize said second un-doped polysilicon layer; and
    performing a threshold voltage ion implantation process and a well ion implantation process to the entire structure including said crystallized second un-doped polysilicon layer, and then performing a thermal process, to thereby form a well region.

2. The method of manufacturing a flash memory device according to claim 1, wherein said oxide film is formed in a thickness of 3000 Å.

3. The method of manufacturing a flash memory device according to claim 1, wherein said pad polysilicon layer is formed in a thickness of 100 Å.

4. The method of manufacturing a flash memory device according to claim 1, wherein said metal silicide layer is formed in a thickness of 1500 to 3000 Å using one of tungsten, titanium, aluminum and copper.

5. The method of manufacturing a flash memory device according to claim 1, wherein said un-doped polysilicon layer is formed in a thickness of 1000 Å.

6. The method of manufacturing a flash memory device according to claim 1, wherein said buffer oxide film is formed in a thickness of 3000 Å.

7. The method of manufacturing a flash memory device according to claim 1, wherein the thickness of said oxide film removed upon etching of said first trench is about ⅓ of the total thickness of said oxide film.

8. The method of manufacturing a flash memory device according to claim 1, wherein said intermediate thermal oxide film is formed in a thickness of 10000 Å.

9. The method of manufacturing a flash memory device according to claim 1, wherein said second ISO mask is defined in a line shape.

10. The method of manufacturing a flash memory device according to claim 1, wherein said second un-doped polysilicon layer is formed in as thickness of 3000 Å.

11. A method of manufacturing a flash memory device, comprising the steps of:
    providing a first semiconductor structure comprising a substrate, an oxide film on top of said substrate, a pad polysilicon layer on top of the oxide film, a metal silicide layer on top of the pad polysilicon layer, a first un-doped polysilicon layer on top of the metal silicide layer, and a buffer oxide film on top of the first un-doped polysilicon layer;
    forming at least one first trench through the buffer oxide film, the first un-doped polysilicon layer, the metal silicide layer, the pad polysilicon layer and at least a portion of the oxide film to thereby define a unit sector;
    filling the first trench with an intermediate thermal oxide film;
    forming at least one second trench through the oxide film and said first un-doped polysilicon layer such that a surface of said metal silicide layer is exposed, to thereby define a unit cell;
    filling the second trench with a second, crystallized polysilicon layer; and
    performing a threshold voltage ion implantation process and a well ion implantation process to the resulting structure including said crystallized second un-doped polysilicon layer, and then performing a thermal process, to thereby form a well region.

12. The method according to claim 11, wherein the step of filling the first trench comprises depositing a thermal oxide film on the resulting structure and flattening the thermal oxide film until the buffer oxide film is exposed, such that the thermal oxide film is present in the first trench and absent from other areas of the resulting structure on which it was deposited.

13. The method according to claim 12, wherein the step of filling the second trench comprises depositing a second un-doped polysilicon layer on the resulting structure, flattening the second un-doped polysilicon layer, and then annealing the second un-doped polysilicon layer to thereby crystallize the second un-doped polysilicon layer.

14. The method according to claim 13, wherein:
said oxide film is formed in a thickness of 3000 Å;
said pad polysilicon layer is formed in a thickness of 100 Å;
said metal silicide layer is formed in a thickness of 1500 to 3000 Å using one of tungsten, titanium, aluminum and copper;
said first un-doped polysilicon layer is formed in a thickness of 1000 Å; and
said buffer oxide film is formed in a thickness of 3000 Å.

15. The method according to claim 14, wherein said intermediate thermal oxide film is formed in a thickness of 10000 Å.

16. The method according to claim 15, wherein said second un-doped polysilicon layer is formed in a thickness of 3000 Å.

17. The method according to claim 13, wherein the thickness of said oxide film through which the first trench is formed is about ⅓ of the total thickness of said oxide film.

18. The method according to claim 13, wherein the step of forming the first trench comprises etching the semiconductor structure using a first ISO mask corresponding to a predetermined block size.

19. The method according to claim 18, wherein the step of forming the second trench comprises etching selected regions of the buffer oxide film and the first un-doped polysilicon layer using a second ISO mask which is defined in a line shape.

* * * * *